US012726207B2

(12) United States Patent
Deng et al.

(10) Patent No.: US 12,726,207 B2
(45) Date of Patent: Sep. 1, 2026

(54) OSCILLATOR CIRCUIT

(71) Applicant: SG MICRO CORP, Beijing (CN)

(72) Inventors: Yangyang Deng, Beijing (CN); Yu Wang, Beijing (CN)

(73) Assignee: SG MICRO CORP, Beijing (CN)

( * ) Notice: Subject to any disclaimer, the term of this patent is extended or adjusted under 35 U.S.C. 154(b) by 4 days.

(21) Appl. No.: 19/109,583

(22) PCT Filed: Apr. 25, 2023

(86) PCT No.: PCT/CN2023/090710

§ 371 (c)(1),
(2) Date: Mar. 7, 2025

(87) PCT Pub. No.: WO2024/051178

PCT Pub. Date: Mar. 14, 2024

(65) Prior Publication Data

US 2026/0100715 A1 Apr. 9, 2026

(30) Foreign Application Priority Data

Sep. 9, 2022 (CN) ......................... 202211104902.0

(51) Int. Cl.
*H03D 3/24* (2006.01)
*H03L 7/099* (2006.01)

(52) U.S. Cl.
CPC .................................. *H03L 7/0997* (2013.01)

(58) Field of Classification Search
CPC ..................................................... H03L 7/0997
USPC ......................... 375/376, 373, 219, 295, 316
See application file for complete search history.

(56) References Cited

U.S. PATENT DOCUMENTS

2006/0139073 A1 6/2006 Lee et al.
2024/0176386 A1* 5/2024 Fan .......................... G06F 1/12

FOREIGN PATENT DOCUMENTS

| | | | |
|---|---|---|---|
| CN | 113992004 | A | 1/2022 |
| CN | 114465620 | A | 5/2022 |
| CN | 115549675 | A | 12/2022 |
| JP | 2017200115 | A | 11/2017 |

* cited by examiner

*Primary Examiner* — Zewdu A Kassa
(74) *Attorney, Agent, or Firm* — Bayramoglu Law Offices LLC

(57) ABSTRACT

An oscillator circuit includes a frequency setting circuit, a first and a second clock signal generating circuit, a clock synchronization circuit, a control circuit, and an output circuit. The first and second clock signal generating circuits generate first and second clock signals respectively. The control circuit outputs a frequency setting signal via a second node, outputs the first clock signal via a sixth node, and outputs the second clock signal via a seventh node when the first frequency selecting signal is at an effective voltage level; otherwise, outputs a second synchronization control signal via the second node, outputs an external synchronization clock signal via the sixth node, and outputs a first clock signal via the seventh node. The clock synchronization circuit generates the first and second synchronization control signals. The output circuit outputs the first or second clock signal.

20 Claims, 4 Drawing Sheets

OSCILLATOR CIRCUIT

CROSS REFERENCE TO THE RELATED APPLICATIONS

This application is the national phase entry of International Application No. PCT/CN2023/090710, filed on Apr. 25, 2023, which is based upon and claims priority to Chinese Patent Application No. 202211104902.0, filed on Sep. 9, 2022, the entire contents of which are incorporated herein by reference.

TECHNICAL FIELD

The embodiments of the present disclosure relate to a field of integrated circuit technology, in particular to an oscillator circuit.

BACKGROUND

Oscillator circuits are widely used in various integrated circuits to provide clock signals to the integrated circuits. In some application scenarios, a frequency of the oscillator needs to be switched between a frequency set by an external resistor and a frequency of an external synchronization clock signal. In this case, a phase-locked loop in the oscillator needs to be rebuilt. Therefore, there will be a sudden change in the frequency of the oscillator, resulting in an overshoot or undershoot in the output voltage of the integrated circuit (such as a DC-DC converter) adopting the oscillator, which is unfavorable to the peripheral applications of the oscillator.

SUMMARY

The embodiment described herein provides an oscillator circuit.

According to a first aspect of the present disclosure, there is provided an oscillator circuit. The oscillator circuit includes a frequency setting circuit, a first clock signal generating circuit, a second clock signal generating circuit, a clock synchronization circuit, a control circuit, and an output circuit. The frequency setting circuit is configured to generate a frequency setting signal and provide the frequency setting signal to the control circuit via a first node. The first clock signal generating circuit is configured to generate a first clock signal based on a signal outputted from the control circuit via a second node, and provide the first clock signal to the control circuit and the output circuit via a third node. The second clock signal generating circuit is configured to generate a second clock signal based on the first synchronization control signal outputted from the clock synchronization circuit via a fourth node, and provide the second clock signal to the control circuit and the output circuit via a fifth node. The control circuit is configured to output a frequency setting signal via a second node, output a first clock signal via a sixth node, and output the second clock signal via a seventh node, when a first frequency selecting signal is at an effective voltage level; and configured to output a second synchronization control signal from the clock synchronization circuit via the second node, output an external synchronization clock signal via the sixth node, and output the first clock signal via the seventh node, when the first frequency selecting signal is at an ineffective voltage level. The clock synchronization circuit is configured to generate the first synchronization control signal and the second synchronization control signal based on a signal inputted via the sixth node and a signal inputted via the seventh node, and output the second synchronization control signal via an eighth node. The output circuit is configured to output the second clock signal when the first frequency selecting signal is at an effective voltage level; and configured to output the first clock signal when the first frequency selecting signal is at an ineffective voltage level. Under a control of the first synchronization control signal or the second synchronization control signal, a frequency of a signal inputted to the clock synchronization circuit via the seventh node is equal to the frequency of a signal inputted to the clock synchronization circuit via the sixth node.

In some embodiments of the present disclosure, the frequency setting circuit includes: an operational amplifier, a first resistor, a second resistor, a first transistor, a second transistor, and a third transistor. Wherein the first input terminal of the operational amplifier is coupled to a reference voltage terminal. A second input terminal of the operational amplifier is coupled to a first end of the first resistor. An output terminal of the operational amplifier is coupled to a control electrode of the first transistor. A second end of the first resistor is coupled to a second voltage terminal. A first end of the second resistor is coupled to a first electrode of the first transistor. A second end of the second resistor is coupled to the first end of the first resistor. A second electrode of the first transistor is coupled to a control electrode and a second electrode of the second transistor. A first electrode of the second transistor is coupled to a first voltage terminal. A control electrode of the third transistor is coupled to the control electrode of the second transistor. A first electrode of the third transistor is coupled to the first voltage terminal. A second electrode of the third transistor is coupled to the first node.

In some embodiments of the present disclosure, the first clock signal generating circuit includes a first capacitor, a first voltage-controlled switch, and a first voltage comparator. Wherein a first end of the first capacitor is coupled to the second node, and a second end of the first capacitor is coupled to a second voltage terminal. A voltage-controlled end of the first voltage-controlled switch is coupled to an output terminal of the first voltage comparator. A first end of the first voltage-controlled switch is coupled to the second node. A second end of the first voltage-controlled switch is coupled to the second voltage terminal. A first input terminal of the first voltage comparator is coupled to the second node. A second input terminal of the first voltage comparator is coupled to a third voltage terminal. The first voltage comparator is a hysteretic voltage comparator.

In a further embodiment of the present disclosure, the first input terminal of the first voltage comparator is a non-inverting input terminal. The second input terminal of the first voltage comparator is an inverting input terminal.

In some embodiments of the present disclosure, the first clock signal generating circuit includes a first capacitor, a first voltage-controlled switch, a first voltage comparator, and a first one-way delay circuit. Wherein a first end of the first capacitor is coupled to the second node. A second end of the first capacitor is coupled to a second voltage terminal. The voltage-controlled end of the first voltage-controlled switch is coupled to an output terminal of the first one-way delay circuit. A first end of the first voltage-controlled switch is coupled to the second node. A second end of the first voltage-controlled switch is coupled to the second voltage terminal. A first input terminal of the first voltage comparator is coupled to the second node. A second input terminal of the first voltage comparator is coupled to a third voltage terminal. An output terminal of the first voltage comparator is coupled to an input terminal of the first one-way delay circuit.

In a further embodiment of the present disclosure, the first input terminal of the first voltage comparator is a non-inverting input terminal. The second input terminal of the first voltage comparator is an inverting input terminal. The first one-way delay circuit is configured to continuously output a high voltage level signal for a predetermined period upon receiving a high voltage level signal.

In some embodiments of the present disclosure, the second clock signal generating circuit includes a second capacitor, a second voltage-controlled switch, and a second voltage comparator. Wherein a first end of the second capacitor is coupled to the fourth node. A second end of the second capacitor is coupled to the second voltage terminal. A voltage-controlled end of the second voltage-controlled switch is coupled to an output terminal of the second voltage comparator. A first end of the second voltage-controlled switch is coupled to the fourth node. A second end of the second voltage-controlled switch is coupled to the second voltage terminal. A first input terminal of the second voltage comparator is coupled to the fourth node. A second input terminal of the second voltage comparator is coupled to a fourth voltage terminal. The second voltage comparator is a hysteretic voltage comparator.

In a further embodiment of the present disclosure, the first input terminal of the second voltage comparator is a non-inverting input terminal. The second input terminal of the second voltage comparator is an inverting input terminal.

In some embodiments of the present disclosure, the second clock signal generating circuit includes a second capacitor, a second voltage-controlled switch, a second voltage comparator, and a second one-way delay circuit. Wherein a first end of the second capacitor is coupled to the fourth node. A second end of the second capacitor is coupled to the second voltage terminal. A voltage-controlled end of the second voltage-controlled switch is coupled to an output terminal of the second one-way delay circuit. A first end of the second voltage-controlled switch is coupled to the fourth node. A second end of the second voltage-controlled switch is coupled to the second voltage terminal. A first input terminal of the second voltage comparator is coupled to the fourth node. A second input terminal of the second voltage comparator is coupled to a fourth voltage terminal. An output terminal of the second voltage comparator is coupled to an input terminal of the second one-way delay circuit.

In a further embodiment of the present disclosure, the first input terminal of the second voltage comparator is a non-inverting input terminal. The second input terminal of the second voltage comparator is an inverting input terminal. The second one-way delay circuit is configured to continuously output a high voltage level signal for a predetermined period upon receiving a high voltage level signal.

In some embodiments of the present disclosure, the clock synchronization circuit includes a frequency and phase discriminator, a third resistor, and a fourth transistor to a seventh transistor. The first input terminal of the frequency and phase discriminator is coupled to the sixth node. The second input terminal of the frequency and phase discriminator is coupled to the seventh node. An output terminal of the frequency and phase discriminator is coupled to a control electrode of the fourth transistor. A first electrode of the fourth transistor is coupled to a first end of the third resistor. A second electrode of the fourth transistor is coupled to a control electrode and a second electrode of a fifth transistor. A first electrode of the fifth transistor is coupled to a first voltage terminal. A control electrode of the sixth transistor is coupled to the control electrode of the fifth transistor. A first electrode of the sixth transistor is coupled to the first voltage terminal. A second electrode of the sixth transistor is coupled to the eighth node. A control electrode of the seventh transistor is coupled to the control electrode of the fifth transistor. A first electrode of the seventh transistor is coupled to the first voltage terminal. A second electrode of the seventh transistor is coupled to the fourth node. A second end of the third resistor is coupled to a second voltage terminal.

In some embodiments of the present disclosure, the control circuit includes a third voltage-controlled switch to an eighth voltage-controlled switch. Wherein a voltage-controlled end of the third voltage-controlled switch is provided with the first frequency selecting signal. A first end of the third voltage-controlled switch is coupled to the first node. A second end of the third voltage-controlled switch is coupled to the second node. A voltage-controlled end of a fourth voltage-controlled switch is provided with an inverted signal of the first frequency selecting signal. A first end of the fourth voltage-controlled switch is coupled to the eighth node. A second end of the fourth voltage-controlled switch is coupled to the second node. A voltage-controlled end of the fifth voltage-controlled switch is provided with the first frequency selecting signal. A first end of the fifth voltage-controlled switch is coupled to the third node. A second end of the fifth voltage-controlled switch is coupled to the sixth node. A voltage-controlled end of a sixth voltage-controlled switch is provided with an inverted signal of the first frequency selecting signal. A first end of the sixth voltage-controlled switch is provided with the external synchronization clock signal. A second end of the sixth voltage-controlled switch is coupled to the sixth node. A voltage-controlled end of a seventh voltage-controlled switch is provided with the first frequency selecting signal. A first end of the seventh voltage-controlled switch is coupled to the seventh node. A second end of the seventh voltage-controlled switch is coupled to the fifth node. A voltage-controlled end of the eighth voltage-controlled switch is provided with an inverted signal of the first frequency selecting signal. A first end of the eighth voltage-controlled switch is coupled to the seventh node. A second end of the eighth voltage-controlled switch is coupled to the third node.

In some embodiments of the present disclosure, the output circuit includes a ninth voltage-controlled switch and a tenth voltage-controlled switch. Wherein a voltage-controlled end of the ninth voltage-controlled switch is provided with an inverted signal of the first frequency selecting signal. A first end of the ninth voltage-controlled switch is coupled to the third node. A second end of the ninth voltage-controlled switch is coupled to an output terminal of the output circuit. A voltage-controlled end of the tenth voltage-controlled switch is provided with the first frequency selecting signal. A first end of the tenth voltage-controlled switch is coupled to the fifth node. A second end of the tenth voltage-controlled switch is coupled to the output terminal of the output circuit.

According to a second aspect of the present disclosure, there is provided an oscillator circuit. The oscillator circuit includes an operational amplifier, a first resistor, a second resistor, a third resistor, a frequency and phase discriminator, a first transistor to a seventh transistor, a first capacitor, a second capacitor, a first voltage-controlled switch to a tenth voltage-controlled switch, a first voltage comparator, a second voltage comparator, a first one-way delay circuit, and a second one-way delay circuit. Wherein a first input terminal of the operational amplifier is coupled to a reference voltage terminal. A second input terminal of the operational amplifier is coupled to a first end of the first resistor. An output terminal of the operational amplifier is coupled to a control electrode of the first transistor. A second end of the first resistor is coupled to a second voltage terminal. A first end of the second resistor is coupled to a first electrode of the first transistor. A second end of the second resistor is coupled to the first end of the first resistor. A second electrode of the first transistor is coupled to a control electrode and a second electrode of a second transistor. A first electrode of the second transistor is coupled to a first voltage terminal. A control electrode of a third transistor is coupled to the control electrode of the second transistor. A first electrode of the third transistor is coupled to the first voltage terminal, and a second electrode of the third transistor is coupled to a first end of a third voltage-controlled switch. A voltage-controlled end of the third voltage-controlled switch is provided with a first frequency selecting signal. A second end of the third voltage-controlled switch is coupled to a first end of the first capacitor. A second end of the first capacitor is coupled to the second voltage terminal. A voltage-controlled end of the first voltage-controlled switch is coupled to an output terminal of the first one-way delay circuit. A first end of the first voltage-controlled switch is coupled to the first end of the first capacitor. A second end of the first voltage-controlled switch is coupled to the second voltage terminal. A first input terminal of the first voltage comparator is coupled to the first end of the first capacitor. A second input terminal of the first voltage comparator is coupled to a third voltage terminal. An output terminal of the first voltage comparator is coupled to an input terminal of the first one-way delay circuit. A first end of the second capacitor is coupled to a second electrode of a seventh transistor. A second end of the second capacitor is coupled to the second voltage terminal. A voltage-controlled end of a second voltage-controlled switch is coupled to an output terminal of the second one-way delay circuit. A first end of the second voltage-controlled switch is coupled to the first end of the second capacitor. A second end of the second voltage-controlled switch is coupled to the second voltage terminal. A first input terminal of the second voltage comparator is coupled to the first end of the second capacitor. A second input terminal of the second voltage comparator is coupled to a fourth voltage terminal. An output terminal of the second voltage comparator is coupled to an input terminal of the second one-way delay circuit. A voltage-controlled end of a fourth voltage-controlled switch is provided with an inverted signal of the first frequency selecting signal. A first end of the fourth voltage-controlled switch is coupled to a second electrode of a sixth transistor. A second end of the fourth voltage-controlled switch is coupled to the second end of the third voltage-controlled switch. A voltage-controlled end of a fifth voltage-controlled switch is provided with the first frequency selecting signal. A first end of the fifth voltage-controlled switch is coupled to the output terminal of the first one-way delay circuit. A second end of the fifth voltage-controlled switch is coupled to a first input terminal of the frequency and phase discriminator. A voltage-controlled end of a sixth voltage-controlled switch is provided with an inverted signal of the first frequency selecting signal. A first end of the sixth voltage-controlled switch is provided with an external synchronization clock signal. A second end of the sixth voltage-controlled switch is coupled to the first input end of the frequency and phase discriminator. A voltage-controlled end of a seventh voltage-controlled switch is provided with the first frequency selecting signal. A first end of the seventh voltage-controlled switch is coupled to a second input terminal of the frequency and phase discriminator. A second end of the seventh voltage-controlled switch is coupled to the output terminal of the second one-way delay circuit. A voltage-controlled end of an eighth voltage-controlled switch is provided with an inverted signal of the first frequency selecting signal. A first end of the eighth voltage-controlled switch is coupled to the second input terminal of the frequency and phase discriminator. A second end of the eighth voltage-controlled switch is coupled to the output terminal of the first one-way delay circuit. An output terminal of the frequency and phase discriminator is coupled to a control electrode of a fourth transistor. A first electrode of the fourth transistor is coupled to a first end of the third resistor. A second electrode of the fourth transistor is coupled to a control electrode and a second electrode of the fifth transistor. A first electrode of the fifth transistor is coupled to the first voltage terminal. A control electrode of a sixth transistor is coupled to the control electrode of the fifth transistor. A first electrode of the sixth transistor is coupled to the first voltage terminal. A control electrode of the seventh transistor is coupled to the control electrode of the fifth transistor. A first electrode of the seventh transistor is coupled to the first voltage terminal. A second end of the third resistor is coupled to the second voltage terminal. The voltage-controlled end of a ninth voltage-controlled switch is provided with an inverted signal of the first frequency selecting signal. A first end of the ninth voltage-controlled switch is coupled to the output terminal of the first one-way delay circuit. A second end of the ninth voltage-controlled switch is coupled to the output terminal of the oscillator circuit. The voltage-controlled end of the tenth voltage-controlled switch is provided with the first frequency selecting signal. A first end of the tenth voltage-controlled switch is coupled to the output terminal of the second one-way delay circuit. A second end of the tenth voltage-controlled switch is coupled to the output terminal of the oscillator circuit.

BRIEF DESCRIPTION OF THE DRAWINGS

To describe technical solutions of the embodiments of the present disclosure more clearly, the accompanying drawings of the embodiments will be briefly introduced in the following. It should be known that the accompanying drawings in the following description merely involve with some embodiments of the present disclosure, but not limit the present disclosure, in which.

In the drawings, the reference numbers having the same last two-digit correspond to the same elements. It should be noted that the elements in the drawings are schematic and not drawn to scale.

DETAILED DESCRIPTION OF THE EMBODIMENTS

To make objectives, technical solutions and advantages of the embodiments of the present disclosure clearer, the technical solutions in the embodiments of the present disclosure will be described clearly and completely below, in conjunction with the accompanying drawings in the embodiments of the present disclosure. Obviously, the described embodiments are merely some but not all of the embodiments of the present disclosure. All other embodiments obtained by those skilled in the art based on the described embodiments of the present disclosure without creative efforts shall fall within the protecting scope of the present disclosure.

Unless otherwise defined, all terms (including technical and scientific terms) used herein have the same meaning as commonly understood by those skilled in the art to which present disclosure belongs. It will be further understood that terms, such as those defined in commonly used dictionaries, should be interpreted as having a meaning that is consistent with their meaning in the context of the specification and will not be interpreted in an idealized or overly formal sense unless expressly so defined herein. As used herein, the description of "connecting" or "coupling" two or more parts together should refer to the parts being directly combined together or being combined via one or more intermediate components.

In all the embodiments of the present disclosure, a source and a drain (an emitter and a collector) of a transistor are symmetrical, and a current from the source to the drain (from the emitter to the collector) to turn on an N-type transistor is in an opposite direction with respect to the current from the source to the drain (from the emitter and the collector) to turn on a P-type transistor. Therefore, in the embodiments of the present disclosure, a controlled intermediate terminal of the transistor is referred to as a control electrode, and the remaining two terminals are referred to as a first electrode and a second electrode. In addition, terms such as "first" and "second" are only used to distinguish one component (or part of a component) from another component (or another part of a component).

Figure 1:
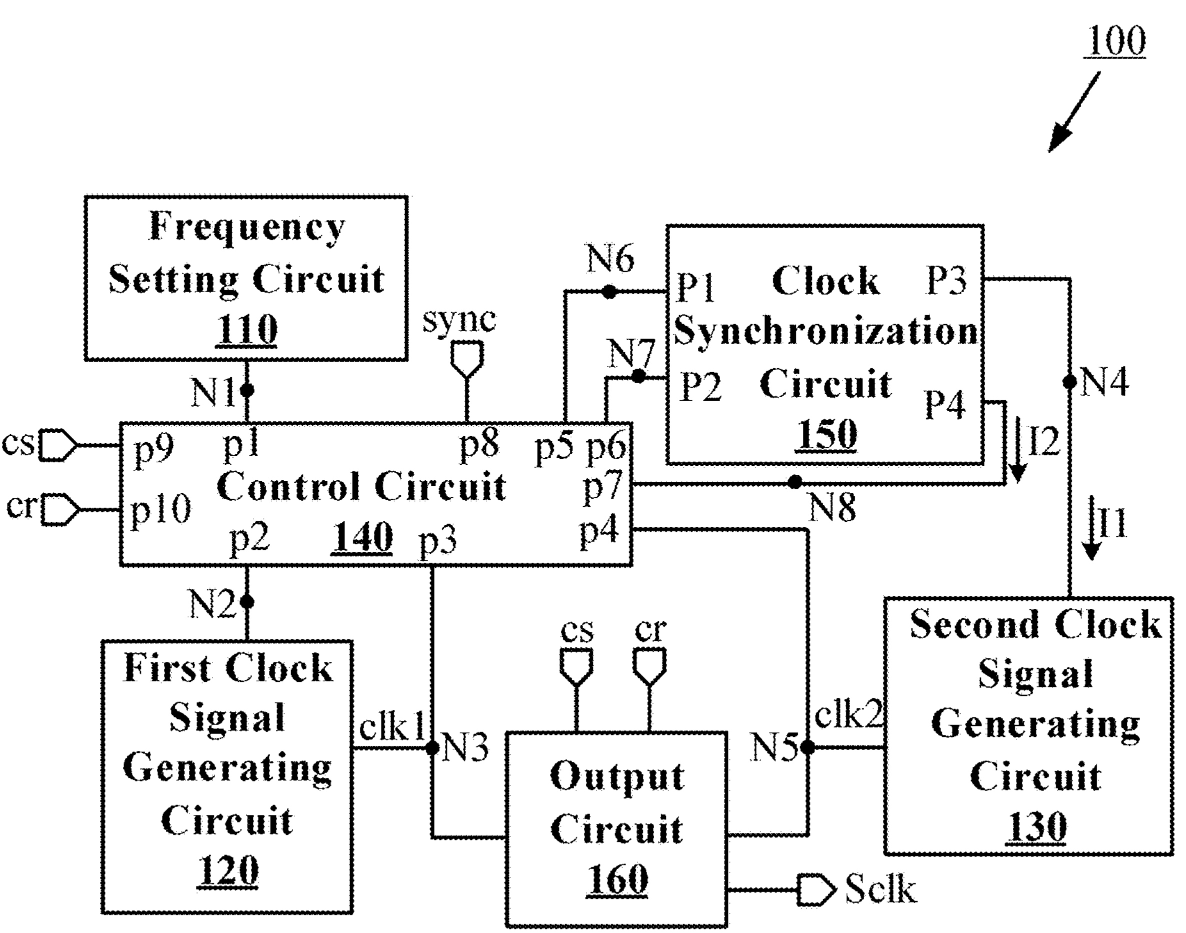
FIG. 1 is a schematic block diagram of an oscillator circuit according to an embodiment of the present disclosure.

FIG. 1 shows a schematic block diagram of an oscillator circuit 100 according to an embodiment of the present disclosure. The oscillator circuit 100 includes a frequency setting circuit 110, a first clock signal generating circuit 120, a second clock signal generating circuit 130, a clock synchronization circuit 150, a control circuit 140, and an output circuit 160.

The frequency setting circuit 110 may be coupled to a first terminal p1 of the control circuit 140 via a first node N1. The frequency setting circuit 110 may be configured to generate a frequency setting signal and provide the frequency setting signal to a first end of the control circuit 140 via the first node N1.

The first clock signal generating circuit 120 may be coupled to a second terminal p2 of the control circuit 140 via a second node N2. The first clock signal generating circuit 120 may be coupled to a third terminal p3 of the control circuit 140 and the output circuit 160 via a third node N3. The first clock signal generating circuit 120 may be configured to generate a first clock signal clk1 based on a signal outputted from the control circuit 140 (from its second terminal p2) via the second node N2, and provide the first clock signal clk1 to the third terminal p3 of the control circuit 140 and output circuit 160 via the third node N3.

The second clock signal generating circuit 130 may be coupled to a third terminal P3 of the clock synchronization circuit 150 via a fourth node N4. The second clock signal generating circuit 130 may be coupled to a fourth terminal p4 of the control circuit 140 and the output circuit 160 via a fifth node N5. The second clock signal generating circuit 130 may be configured to generate a second clock signal clk2 based on a first synchronization control signal I1 outputted from the clock synchronization circuit 150 (from its third terminal P3) via the fourth node N4, and provide the second clock signal clk2 to the fourth terminal p4 of the control circuit 140 and output circuit 160 via the fifth node N5.

The first terminal p1 of the control circuit 140 may be coupled to the frequency setting circuit 110 via the first node N1. The second terminal p2 of the control circuit 140 may be coupled to the first clock signal generating circuit 120 via the second node N2. The third terminal p3 of the control circuit 140 may be coupled to the first clock signal generating circuit 120 and the output circuit 160 via the third node N3. The fourth terminal p4 of the control circuit 140 may be coupled to the second clock signal generating circuit 130 and the output circuit 160 via the fifth node N5. A fifth terminal p5 of the control circuit 140 may be coupled to the first terminal P1 of the clock synchronization circuit 150 via a sixth node N6. A sixth terminal p6 of the control circuit 140 may be coupled to the second terminal P2 of the clock synchronization circuit 150 via a seventh node N7. A seventh terminal p7 of the control circuit 140 may be coupled to the fourth terminal P4 of the clock synchronization circuit 150 via a eighth node N8. An eighth terminal p8 of the control circuit 140 may be coupled to an external synchronization clock signal terminal sync. A tenth terminal p10 of the control circuit 140 may be coupled to a first frequency selecting signal terminal cr. A ninth terminal p9 of the control circuit 140 may be coupled to a second frequency selecting signal terminal cs. A second frequency selecting signal cs from the second frequency selecting signal terminal cs may be an inverted signal of a first frequency selecting signal cr from the first frequency selecting signal terminal cr. The control circuit 140 may be configured to output a frequency setting signal via the second node N2, output a first clock signal clk1 via the sixth node N6, and output a second clock signal clk2 via the seventh node N7, when the first frequency selecting signal cr is at an effective voltage level. The control circuit 140 may also be configured to output a second synchronization control signal I2 from the clock synchronization circuit 150 via the second node N2, output the external synchronization clock signal sync from the external synchronization clock signal terminal sync via the sixth node N6, and output the first clock signal clk1 via the seventh node N7, when the first frequency selecting signal cr is at an ineffective voltage level.

The first terminal P1 of the clock synchronization circuit 150 may be coupled to the fifth terminal p5 of the control circuit 140 via the sixth node N6. The second terminal P2 of the clock synchronization circuit 150 may be coupled to the sixth terminal p6 of the control circuit 140 via the seventh node N7. The third terminal P3 of the clock synchronization circuit 150 may be coupled to the second clock signal generating circuit 130 via the fourth node N4. The fourth terminal P4 of the clock synchronization circuit 150 may be coupled to the seventh terminal p7 of the control circuit 140 via the eighth node N8. The clock synchronization circuit 150 may be configured to generate the first synchronization control signal I1 and the second synchronization control signal I2 based on a signal inputted via the sixth node N6 and a signal inputted via the seventh node N7, output the second synchronization control signal I2 via the eighth node N8, and output the first synchronization control signal I1 via the fourth node N4. In some embodiments of the present disclosure, a phase-locked loop is provided in the clock synchronization circuit 150.

The output circuit 160 may be coupled to the first clock signal generating circuit 120 and the third terminal p3 of the control circuit 140 via the third node N3. The output circuit 160 may be coupled to the second clock signal generating circuit 130 and the fourth terminal p4 of the control circuit 140 via the fifth node N5. The output circuit 160 may be coupled to the first frequency selecting signal terminal cr. The output circuit 160 may also be coupled to the second frequency selecting signal terminal cs. The output circuit 160 may be configured to output the second clock signal clk2 as a system clock signal Sclk when the first frequency selecting signal cr is at an effective voltage level. The output circuit 160 may also be configured to output the first clock signal clk1 as the system clock signal Sclk when the first frequency selecting signal cr is at an ineffective voltage level.

In the oscillator circuit 100, under the control of the first synchronization control signal I1 or the second synchronization control signal I2, the frequency of the signal inputted to the clock synchronization circuit 150 via the seventh node N7 is equal to the frequency of the signal inputted to the clock synchronization circuit 150 via the sixth node N6.

When the frequency of the oscillator circuit 100 is changed from being set by the external synchronization clock signal sync to being set by the frequency setting circuit 110, the first frequency selecting signal cr may be set at the effective voltage level and the second frequency selecting signal cs may be set at the ineffective voltage level. The frequency setting signal generated by the frequency setting circuit 110 is provided to the first clock signal generating circuit 120 under the control of the control circuit 140. The first clock signal generating circuit 120 generates the first clock signal clk1 based on the frequency setting signal. The first clock signal clk1 is provided to the first terminal P1 of the clock synchronization circuit 150 under the control of the control circuit 140. The second clock signal clk2 is provided to the second terminal P2 of the clock synchronization circuit 150 under the control of the control circuit 140. The clock synchronization circuit 150 adjusts the frequency of the second clock signal clk2 by providing the first synchronization control signal I1 to the second clock signal generating circuit 130, such that the frequency of the second clock signal clk2 is equal to the frequency of the first clock signal clk1. In this case, the phase-locked loop of the clock synchronization circuit 150 is activated. The second clock signal clk2 is outputted from the output circuit 160 as the system clock signal Sclk (e.g., of a DC-DC converter).

When the frequency of the oscillator circuit 100 is changed from being set by the frequency setting circuit 110 to being set by the external synchronization clock signal sync, the first frequency selecting signal cr may be set at the ineffective voltage level and the second frequency selecting signal cs may be set at the effective voltage level. The external synchronization clock signal sync is provided to the first terminal P1 of the clock synchronization circuit under the control of the control circuit 140. The first clock signal clk1 is provided to the second terminal P2 of the clock synchronization circuit under the control of the control circuit 140. The second synchronization control signal I2 from the clock synchronization circuit 150 is provided to the first clock signal generating circuit 120 under the control of the control circuit 140, for adjusting the frequency of the first clock signal clk1, such that the frequency of the first clock signal clk1 is equal to the frequency of the external synchronization clock signal sync. In this case, the phase-locked loop of the clock synchronization circuit 150 is activated. The first clock signal clk1 is outputted from the output circuit 160 as the system clock signal Sclk (e.g., of a DC-DC converter).

In this way, when the frequency of the oscillator circuit 100 is switched, the phase-locked loop of the oscillator circuit 100 does not need to be rebuilt, and therefore, the frequency switching of the oscillator circuit 100 is smooth.

Figure 2:
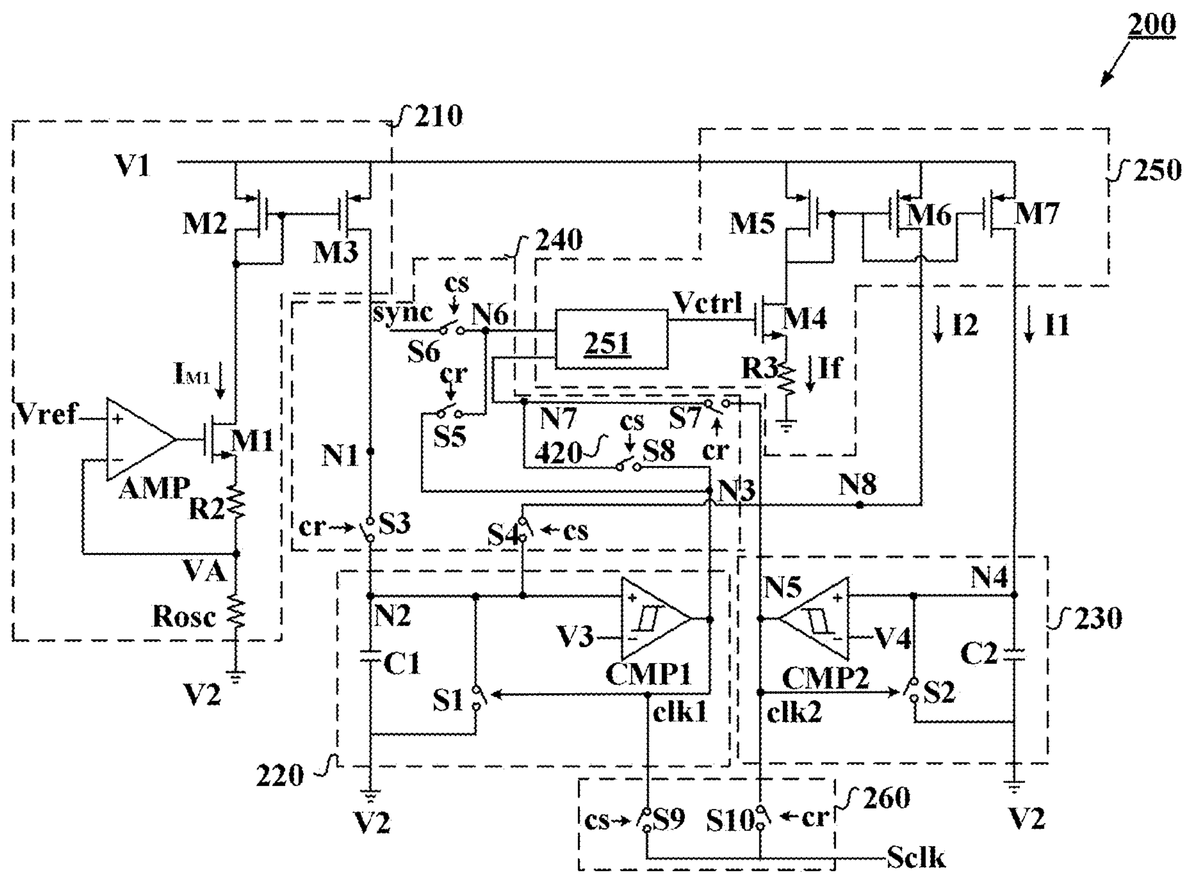
FIG. 2 is an exemplary circuit diagram of an oscillator circuit according to an embodiment of the present disclosure.

FIG. 2 shows an exemplary circuit diagram of an oscillator circuit 200 according to an embodiment of the present disclosure. In the example of FIG. 2, the frequency setting circuit 210 may include: an operational amplifier AMP, a first resistor Rosc, a second resistor R2, a first transistor M1, a second transistor M2, and a third transistor M3. The first input terminal of the operational amplifier AMP is coupled to a reference voltage terminal Vref. The second input terminal of the operational amplifier AMP is coupled to a first end of the first resistor Rosc. The output terminal of the operational amplifier AMP is coupled to a control electrode of the first transistor M1. A second end of the first resistor Rosc is coupled to a second voltage terminal V2. A first end of the second resistor R2 is coupled to a first electrode of the first transistor M1. A second end of the second resistor R2 is coupled to the first end of the first resistor Rosc. A second electrode of the first transistor M1 is coupled to a control electrode and a second electrode of the second transistor M2. A first electrode of the second transistor M2 is coupled to the first voltage terminal V1. A control electrode of the third transistor M3 is coupled to the control electrode of the second transistor M2. A first electrode of the third transistor M3 is coupled to a first voltage terminal V1. A second electrode of the third transistor M3 is coupled to the first node N1.

According to the virtual short and virtual break characteristics of the operational amplifier AMP, the voltage VA at the first end of the first resistor Rosc is equal to a reference voltage Vref from the reference voltage terminal Vref. Therefore, the current $I_{M1}$ flowing through the first transistor M1 is equal to Vref/Rosc, that is $I_{M1}$=Vref/Rosc. Wherein Rosc represents the resistance value of the first resistor Rosc. After a current mirror formed by the second transistor M2 and the third transistor M3 copying the current $I_{M1}$, the frequency setting circuit 210 may output the current $I_{M1}$ via the first node N1. The magnitude of the current $I_{M1}$ may be adjusted by adjusting the resistance value of the first resistor Rosc. In some embodiments of the present disclosure, the first resistor Rosc is arranged outside a package of the oscillator circuit 200, such that it is convenient to replace the first resistor Rosc according to practical applications.

The first clock signal generating circuit 220 may include a first capacitor C1, a first voltage-controlled switch S1, and a first voltage comparator CMP1. Wherein a first end of the first capacitor C1 is coupled to the second node N2. A second end of the first capacitor C1 is coupled to the second voltage terminal V2. The voltage-controlled end of the first voltage-controlled switch S1 is coupled to an output terminal of the first voltage comparator CMP1. A first end of the first voltage-controlled switch S1 is coupled to the second node N2. A second end of the first voltage-controlled switch S1 is coupled to the second voltage terminal V2. A first input terminal of the first voltage comparator CMP1 is coupled to the second node N2. A second input terminal of the first voltage comparator CMP1 is coupled to a third voltage terminal V3. Wherein the first voltage comparator CMP1 is a hysteretic voltage comparator.

The current inputted via the second node N2 may charge the first capacitor C1. When the voltage of the second node N2 rises to a third voltage V3 from the third voltage terminal V3, the first clock signal clk1 outputted from the first voltage comparator CMP1 is transitioned to a high voltage level, thereby controlling the first voltage-controlled switch S1 to be closed. The first capacitor C1 starts discharging. When the voltage of the second node N2 drops to (V3-ΔV), the first clock signal clk1 outputted from the first voltage comparator CMP1 is transitioned to a low voltage level. Wherein ΔV represents a hysteresis voltage. The current inputted via the second node N2 and the capacitance value of the first capacitor C1 may determine the frequency of the first clock signal clk1 outputted from the first voltage comparator CMP1.

The second clock signal generating circuit 230 may include a second capacitor C2, a second voltage-controlled switch S2, and a second voltage comparator CMP2. Wherein a first end of the second capacitor C2 is coupled to the fourth node N4. A second end of the second capacitor C2 is coupled to the second voltage terminal V2. A voltage-controlled end of the second voltage-controlled switch S2 is coupled to an output terminal of the second voltage comparator CMP2. A first end of the second voltage-controlled switch S2 is coupled to the fourth node N4. A second end of the second voltage-controlled switch S2 is coupled to the second voltage terminal V2. A first input terminal of the second voltage comparator CMP2 is coupled to the fourth node N4. A second input terminal of the second voltage comparator CMP2 is coupled to a fourth voltage terminal V4. Wherein the second voltage comparator CMP2 is the hysteretic voltage comparator.

The current inputted via the fourth node N4 may charge the second capacitor C2. When the voltage of the fourth node N4 rises to a fourth voltage V4 from the fourth voltage terminal V4, the second clock signal clk2 outputted from the second voltage comparator CMP2 is transitioned to the high voltage level, thereby controlling the second voltage-controlled switch S2 to be closed. The second capacitor C2 starts discharging. When the voltage of the fourth node N4 drops to (V4-ΔV), the second clock signal clk2 outputted from the second voltage comparator CMP2 is transitioned to the low voltage level. Wherein ΔV represents the hysteresis voltage. The current inputted via the fourth node N4 and the capacitance value of the second capacitor C2 may determine the frequency of the second clock signal clk2 outputted from the second voltage comparator CMP2.

The clock synchronization circuit 250 may include a frequency and phase discriminator 251, a third resistor R3, and a fourth transistor M4 to a seventh transistor M7. The frequency and phase discriminator 251, the third resistor R3, and the fourth transistor M4 may form a phase-locked loop (PLL). A first input terminal of the frequency and phase discriminator 251 is coupled to the sixth node N6. A second input terminal of the frequency and phase discriminator 251 is coupled to the seventh node N7. An output terminal of the frequency and phase discriminator 251 is coupled to the control electrode of the fourth transistor M4. A first electrode of the fourth transistor M4 is coupled to a first end of the third resistor R3. A second electrode of the fourth transistor M4 is coupled to a control electrode and a second electrode of a fifth transistor M5. A first electrode of the fifth transistor M5 is coupled to the first voltage terminal V1. A control electrode of a sixth transistor M6 is coupled to the control electrode of the fifth transistor M5. A first electrode of the sixth transistor M6 is coupled to the first voltage terminal V1. A second electrode of the sixth transistor M6 is coupled to the eighth node N8. A control electrode of the seventh transistor M7 is coupled to a control electrode of the fifth transistor M5. A first electrode of the seventh transistor M7 is coupled to the first voltage terminal V1. A second electrode of the seventh transistor M7 is coupled to the fourth node N4. A second end of the third resistor R3 is coupled to the second voltage terminal V2.

The control circuit 240 may include a third voltage-controlled switch S3 to an eighth voltage-controlled switch S8. Wherein the voltage-controlled end of the third voltage-controlled switch S3 is provided with a first frequency selecting signal cr. A first end of the third voltage-controlled switch S3 is coupled to the first node N1. A second end of the third voltage-controlled switch S3 is coupled to the second node N2. A voltage-controlled end of a fourth voltage-controlled switch S4 is provided with an inverted signal (the second frequency selecting signal cs) of the first frequency selecting signal cr. A first end of the fourth voltage-controlled switch S4 is coupled to the eighth node N8. A second end of the fourth voltage-controlled switch S4 is coupled to the second node N2. A voltage-controlled end of a fifth voltage-controlled switch S5 is provided with a first frequency selecting signal cr. A first end of the fifth voltage-controlled switch S5 is coupled to the third node N3. A second end of the fifth voltage-controlled switch S5 is coupled to the sixth node N6. A voltage-controlled end of a sixth voltage-controlled switch S6 is provided with an inverted signal (the second frequency selecting signal cs) of the first frequency selecting signal cr. A first end of the sixth voltage-controlled switch S6 is provided with the external synchronization clock signal sync. A second end of the sixth voltage-controlled switch S6 is coupled to the sixth node N6. A voltage-controlled end of a seventh voltage-controlled switch S7 is provided with the first frequency selecting signal cr. A first end of the seventh voltage-controlled switch S7 is coupled to the seventh node N7. A second end of the seventh voltage-controlled switch S7 is coupled to the fifth node N5. A voltage-controlled end of the eighth voltage-controlled switch S8 is provided with an inverted signal (the second frequency selecting signal cs) of the first frequency selecting signal cr. A first end of the eighth voltage-controlled switch S8 is coupled to the seventh node N7. A second end of the eighth voltage-controlled switch S8 is coupled to the third node N3.

The output circuit 260 may include a ninth voltage-controlled switch S9 and a tenth voltage-controlled switch S10. Wherein a voltage-controlled end of the ninth voltage-controlled switch S9 is provided with an inverted signal (the second frequency selecting signal cs) of the first frequency selecting signal cr. A first end of the ninth voltage-controlled switch S9 is coupled to the third node N3. A second end of the ninth voltage-controlled switch S9 is coupled to an output terminal of the output circuit 260. A voltage-controlled end of the tenth voltage-controlled switch S10 is provided with the first frequency selecting signal cr. A first end of the tenth voltage-controlled switch S10 is coupled to the fifth node N5. A second end of the tenth voltage-controlled switch S10 is coupled to an output terminal of the output circuit 260.

In the example of FIG. 2, a high voltage signal is input from the first voltage terminal V1, and the second voltage terminal V2 is grounded. The voltage inputted from the third voltage terminal V3 is equal to the voltage inputted from the fourth voltage terminal V4. The capacitance value of the first capacitor C1 is equal to the capacitance value of the second capacitor C2. The first input terminal of the operational amplifier AMP is the non-inverting input terminal. The second input terminal of the operational amplifier AMP is the inverting input terminal. The first input terminal of the first voltage comparator CMP1 is the non-inverting input terminal. The second input terminal of the first voltage comparator CMP1 is the inverting input terminal. The first input terminal of the second voltage comparator CMP2 is the non-inverting input terminal. The second input terminal of the second voltage comparator CMP2 is the inverting input terminal. The first transistor M1 and the fourth transistor M4 are N-channel metal oxide semiconductor (NMOS) transistors. The second transistor M2, the third transistor M3, and the fifth transistor M5 to the seventh transistor M7 are P-channel metal oxide semiconductor (PMOS) transistors. Those skilled in the art should understand that modifications to the circuit shown in FIG. 2 based on the above inventive concept should also fall within the scope of protection of this disclosure. In this variant, the above transistors and voltage terminals may also have different settings than the example shown in FIG. 2.

Those skilled in the art should understand that the internal structure of each circuit in FIG. 2 is exemplary and can also be implemented by other circuits. The embodiments of the present disclosure are not limited to their specific implementations.

Figure 3:
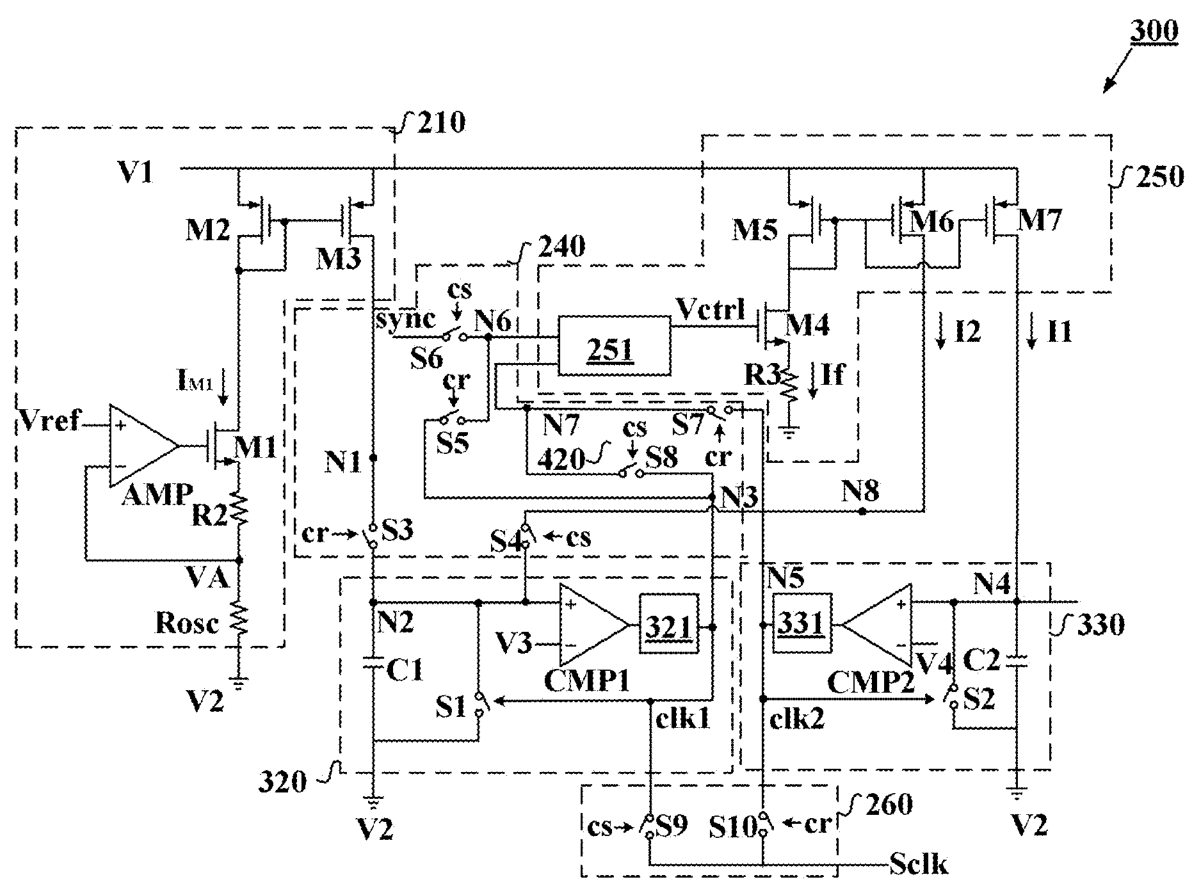
FIG. 3 is another exemplary circuit diagram of an oscillator circuit according to an embodiment of the present disclosure.

FIG. 3 shows an exemplary circuit diagram of an oscillator circuit 300 according to an embodiment of the present disclosure. The oscillator circuit 300 shown in FIG. 3 differs from the oscillator circuit 200 shown in FIG. 2 in that the internal structure of the first clock signal generating circuit 320 and the second clock signal generating circuit 330. The first clock signal generating circuit 320 may include a first capacitor C1, a first voltage-controlled switch S1, a first voltage comparator CMP1, and a first one-way delay circuit 321. Wherein the first end of the first capacitor C1 is coupled to the second node N2. The second end of the first capacitor C1 is coupled to the second voltage terminal V2. The voltage-controlled end of the first voltage-controlled switch S1 is coupled to an output terminal of the first one-way delay circuit 321. The first end of the first voltage-controlled switch S1 is coupled to the second node N2. The second end of the first voltage-controlled switch S1 is coupled to the second voltage terminal V2. The first input terminal of the first voltage comparator CMP1 is coupled to the second node N2. The second input terminal of the first voltage comparator CMP1 is coupled to the third voltage terminal V3. The output terminal of the first voltage comparator CMP1 is coupled to an input terminal of the first one-way delay circuit 321. In some embodiments of the present disclosure, the first one-way delay circuit 321 may be configured to continuously output a high voltage level signal for a predetermined period upon receiving the high voltage level signal. In some embodiments of the present disclosure, the first one-way delay circuit 321 is an RC delay circuit.

The current inputted via the second node N2 may charge the first capacitor C1. When the voltage of the second node N2 rises to a third voltage V3 from the third voltage terminal V3, the signal outputted from the first voltage comparator CMP1 is transitioned to the high voltage level. In this case, the first one-way delay circuit 321 continuously outputs the high voltage level signal for a predetermined period, thereby controlling the first voltage-controlled switch S1 to be closed. The first capacitor C1 starts discharging. Because the first one-way delay circuit 321 continuously outputs the high voltage level signal for a predetermined period, the first clock signal clk1 is not transitioned to the low voltage level until the predetermined period has elapsed. The current inputted via the second node N2 and the capacitance value of the first capacitor C1 may determine the frequency of the first clock signal clk1 outputted from the first voltage comparator CMP1.

The second clock signal generating circuit 330 may include a second capacitor C2, a second voltage-controlled switch S2, a second voltage comparator CMP2, and a second one-way delay circuit 331. Wherein a first end of the second capacitor C2 is coupled to the fourth node N4. A second end of the second capacitor C2 is coupled to the second voltage terminal V2. A voltage-controlled end of the second voltage-controlled switch S2 is coupled to an output terminal of the second one-way delay circuit 331. A first end of the second voltage-controlled switch S2 is coupled to the fourth node N4. A second end of the second voltage-controlled switch S2 is coupled to the second voltage terminal V2. A first input terminal of the second voltage comparator CMP2 is coupled to the fourth node N4. A second input terminal of the second voltage comparator CMP2 is coupled to the fourth voltage terminal V4. An output terminal of the second voltage comparator CMP2 is coupled to an input terminal of the second one-way delay circuit 331. In some embodiments of the present disclosure, the second one-way delay circuit 331 may be configured to continuously output the high voltage level signal for a predetermined period of time upon receiving the high voltage level signal. In some embodiments of the present disclosure, the second one-way delay circuit 331 is the RC delay circuit.

The current inputted via the fourth node N4 may charge the second capacitor C2. When the voltage of the fourth node N4 rises to a fourth voltage V4 from the fourth voltage terminal V4, the signal outputted from the second voltage comparator CMP2 is transitioned to the high voltage level. In this case, the second one-way delay circuit 331 continuously outputs the high voltage level signal for a predetermined period, thereby controlling the second voltage-controlled switch S2 to be closed. The second capacitor C2 starts discharging. Because the second one-way delay circuit 331 continuously outputs the high voltage level signal for a predetermined period, the second clock signal clk2 is not transitioned to the low voltage level until the predetermined perion has elapsed. The current inputted via the fourth node N4 and the capacitance value of the second capacitor C2 may determine the frequency of the second clock signal clk2 outputted from the second voltage comparator CMP2.

Figure 4:
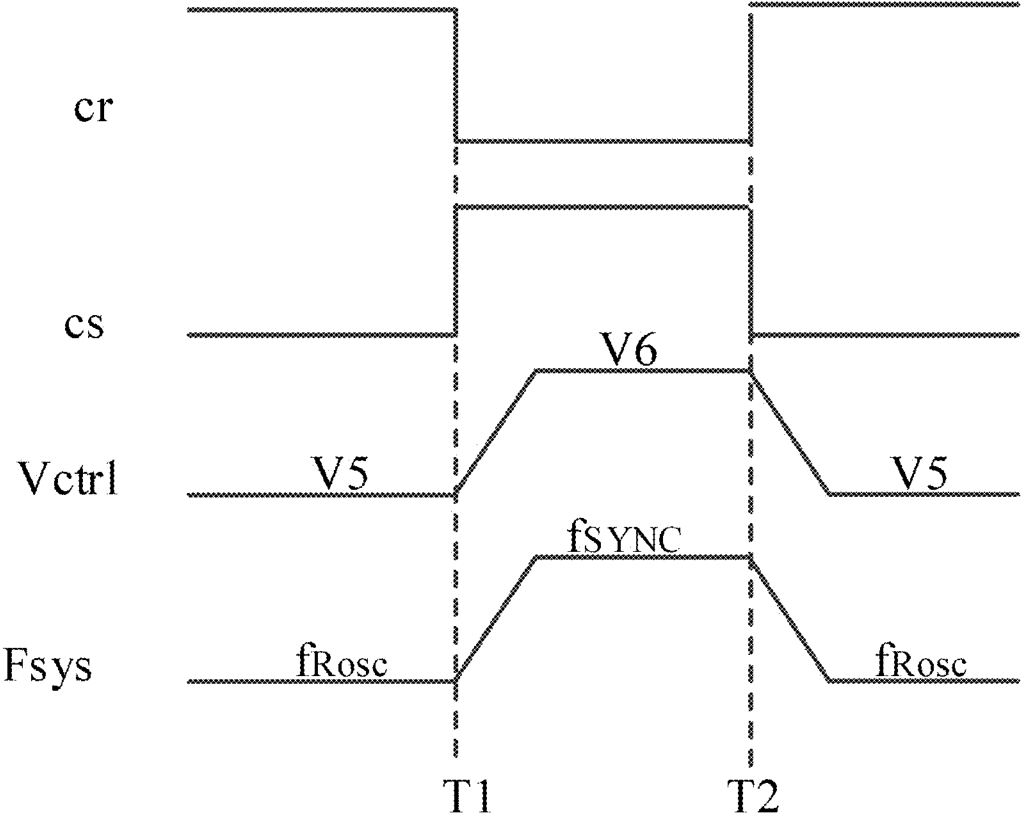
FIG. 4 is a timing diagram of some signals for the oscillator circuit as shown in FIG. 2 or FIG. 3.

FIG. 4 shows a timing diagram of some signals for the oscillator circuit as shown in FIG. 2 or FIG. 3. The working process of the oscillator circuit according to the embodiments of the present disclosure will be described below in conjunction with the examples of FIG. 2 or FIG. 3. In the example of FIG. 4, at time T1, the frequency of the oscillator circuit 100 changes from being set by the first resistor Rosc to being set by the external synchronization clock signal sync. At this time, the first frequency selecting signal cr is transitioned to the ineffective voltage level (low voltage level), and the second frequency selecting signal cs is transitioned to the effective voltage level (high voltage level). The fourth voltage-controlled switch S4, the sixth voltage-controlled switch S6, the eighth voltage-controlled switch S8, and the ninth voltage-controlled switch S9 are turned on. The third voltage-controlled switch S3, the fifth voltage-controlled switch S5, the seventh voltage-controlled switch S7, and the tenth voltage-controlled switch S10 are turned off. The external synchronization clock signal sync and the first clock signal clk1 are provided to the frequency and phase discriminator 251. A voltage Vctrl outputted from the frequency and phase discriminator 251 rises to a sixth voltage V6. The voltage Vctrl is able to control the magnitude of the current If flowing through the fourth transistor M4. The fifth transistor M5 and the sixth transistor M6 constitute a current mirror. The current If is mirrored as a second synchronization control signal I2. The second synchronization control signal I2 is provided to the first capacitor C1 for adjusting the frequency of the first clock signal clk1, such that the frequency of the first clock signal clk1 is equal to the frequency of the external synchronization clock signal sync. In this case, the phase-locked loop of the clock synchronization circuit 150 is activated. The first clock signal clk1 is outputted via the ninth voltage-controlled switch S9 as the system clock signal Sclk (of a DC-DC converter, for example). The frequency Fsys of the system clock signal Sclk smoothly rises to the frequency $f_{SYNC}$ of the external synchronization clock signal sync.

At time T2, the frequency of the oscillator circuit 100 changes from being set by the external synchronization clock signal sync to being set by the first resistor Rosc. At this time, the first frequency selecting signal cr is transitioned to the effective voltage level (high voltage level), and the second frequency selecting signal cs is transitioned to the ineffective voltage level (low voltage level). The fourth voltage-controlled switch S4, the sixth voltage-controlled switch S6, the eighth voltage-controlled switch S8, and the ninth voltage-controlled switch S9 are turned off. The third voltage-controlled switch S3, the fifth voltage-controlled switch S5, the seventh voltage-controlled switch S7, and the tenth voltage-controlled switch S10 are turned on. The first clock signal clk1 and the second clock signal clk2 are provided to the frequency and phase discriminator 251. The voltage Vctrl outputted from the frequency and phase discriminator 251 drops to the fifth voltage V5. The voltage Vctrl is able to control the magnitude of the current If flowing through the fourth transistor M4. The fifth transistor M5 and the seventh transistor M7 form a current mirror. The current If is mirrored as the first synchronization control signal I1. The current $I_{M1}$ flowing through the first transistor M1 is mirrored to the first capacitor C1 to set the frequency of the first clock signal clk1. The first synchronization control signal I1 is provided to the second capacitor C2 for adjusting the frequency of the second clock signal clk2, such that the frequency of the second clock signal clk2 is equal to the frequency of the first clock signal clk1. In this case, the phase-locked loop of the clock synchronization circuit 150 is activated. The second clock signal clk2 is outputted via the tenth voltage-controlled switch S10 as the system clock signal Sclk (of a DC-DC converter, for example). The frequency Fsys of the system clock signal Sclk smoothly drops to the frequency $f_{Rosc}$ set by the first resistor Rosc.

In this way, when the frequency of the oscillator circuit is switched between $f_{SYNC}$ and $f_{Rosc}$, the phase-locked loop of the oscillator circuit does not need to be rebuilt. Therefore, the frequency switching of the oscillator circuit is smooth.

From the above, by keeping the phase-locked loop active, the oscillator circuit according to the embodiments of the present disclosure can smoothly switch frequencies, which can facilitate normal operations of peripheral circuits of the oscillator circuit.

As used herein and in the appended claims, the singular form of a word includes the plural, and vice versa, unless the context clearly dictates otherwise. Thus, singular words are generally inclusive of the plurals of the respective terms. Similarly, the words "include" and "comprise" are to be interpreted as inclusively rather than exclusively. Likewise, the terms "include" and "or" should be construed to be inclusive, unless such an interpretation is clearly prohibited from the context. Where used herein the term "examples," particularly when followed by a listing of terms is merely exemplary and illustrative, and should not be deemed to be exclusive or comprehensive.

Further adaptive aspects and scopes become apparent from the description provided herein. It should be understood that various aspects of the present disclosure may be implemented separately or in combination with one or more other aspects. It should also be understood that the description and specific embodiments in the present disclosure are intended to describe rather than limit the scope of the present disclosure.

A plurality of embodiments of the present disclosure has been described in detail above. However, apparently those skilled in the art may make various modifications and variations on the embodiments of the present disclosure without departing from the spirit and scope of the present disclosure. The scope of protecting of the present disclosure is limited by the appended claims.

What is claimed is:

1. An oscillator circuit, comprising a frequency setting circuit, a first clock signal generating circuit, a second clock signal generating circuit, a clock synchronization circuit, a control circuit, and an output circuit, wherein the frequency setting circuit is configured to generate a frequency setting signal, and provide the frequency setting signal to the control circuit via a first node;

wherein the first clock signal generating circuit is configured to generate a first clock signal based on a signal outputted from the control circuit via a second node, and provide the first clock signal to the control circuit and the output circuit via a third node;

wherein the second clock signal generating circuit is configured to generate a second clock signal based on a first synchronization control signal outputted from the clock synchronization circuit via a fourth node, and provide the second clock signal to the control circuit and the output circuit via a fifth node;

wherein the control circuit is configured to output the frequency setting signal via the second node, output the first clock signal via a sixth node, and output the second clock signal via a seventh node, when a first frequency selecting signal is at an effective voltage level, and configured to output a second synchronization control signal from the clock synchronization circuit via the second node, output an external synchronization clock signal via the sixth node, and output the first clock signal via the seventh node, otherwise;

wherein the clock synchronization circuit is configured to generate the first synchronization control signal and the second synchronization control signal based on a signal inputted via the sixth node and a signal inputted via the seventh node, and output the second synchronization control signal via an eighth node;

wherein the output circuit is configured to output the second clock signal when the first frequency selecting signal is at the effective voltage level, and configured to output the first clock signal otherwise; and wherein a frequency of a signal inputted to the clock synchronization circuit via the seventh node is equal to a frequency of a signal inputted to the clock synchronization circuit via the sixth node, under a control of one of the first synchronization control signal er and the second synchronization control signal.

2. The oscillator circuit according to claim 1, wherein the frequency setting circuit comprises an operational amplifier, a first resistor, a second resistor, a first transistor, a second transistor, and a third transistor, wherein a first input terminal of the operational amplifier is coupled to a reference voltage terminal, a second input terminal of the operational amplifier is coupled to a first end of the first resistor, and an output terminal of the operational amplifier is coupled to a control electrode of the first transistor;

wherein a second end of the first resistor is coupled to a second voltage terminal;

wherein a first end of the second resistor is coupled to a first electrode of the first transistor, and a second end of the second resistor is coupled to the first end of the first resistor;

wherein a second electrode of the first transistor is coupled to a control electrode and a second electrode of the second transistor;

wherein a first electrode of the second transistor is coupled to a first voltage terminal; and wherein a control electrode of the third transistor is coupled to the control electrode of the second transistor, a first electrode of the third transistor is coupled to the first voltage terminal, and a second electrode of the third transistor is coupled to the first node.

3. The oscillator circuit according to claim 2, wherein the first resistor is arranged outside a package of the oscillator circuit.

4. The oscillator circuit according to claim 1, wherein the first clock signal generating circuit comprises a first capacitor, a first voltage-controlled switch, and a first voltage comparator, wherein a first end of the first capacitor is coupled to the second node, and a second end of the first capacitor is coupled to a second voltage terminal;

wherein a voltage-controlled end of the first voltage-controlled switch is coupled to an output terminal of the first voltage comparator, a first end of the first voltage-controlled switch is coupled to the second node, and a second end of the first voltage-controlled switch is coupled to the second voltage terminal;

wherein a first input terminal of the first voltage comparator is coupled to the second node, and a second input terminal of the first voltage comparator is coupled to a third voltage terminal; and wherein the first voltage comparator is a hysteretic voltage comparator.

5. The oscillator circuit according to claim 4, wherein the first input terminal of the first voltage comparator is a non-inverting input terminal of the first voltage comparator, and the second input terminal of the first voltage comparator is an inverting input terminal of the first voltage comparator.

6. The oscillator circuit according to claim 1, wherein the first clock signal generating circuit comprises a first capacitor, a first voltage-controlled switch, a first voltage comparator, and a first one-way delay circuit, wherein a first end of the first capacitor is coupled to the second node, and a second end of the first capacitor is coupled to a second voltage terminal;

wherein a voltage-controlled end of the first voltage-controlled switch is coupled to an output terminal of the first one-way delay circuit, a first end of the first voltage-controlled switch is coupled to the second node, and a second end of the first voltage-controlled switch is coupled to the second voltage terminal; and wherein a first input terminal of the first voltage comparator is coupled to the second node, a second input terminal of the first voltage comparator is coupled to a third voltage terminal, and an output terminal of the first voltage comparator is coupled to an input terminal of the first one-way delay circuit.

7. The oscillator circuit according to claim 6, wherein the first input terminal of the first voltage comparator is a non-inverting input terminal of the first voltage comparator, and the second input terminal of the first voltage comparator is an inverting input terminal of the first voltage comparator, and wherein the first one-way delay circuit is configured to continuously output a high voltage level signal for a predetermined period upon receiving the high voltage level signal.

8. The oscillator circuit according to claim 1, wherein the second clock signal generating circuit comprises a second capacitor, a second voltage-controlled switch, and a second voltage comparator, wherein a first end of the second capacitor is coupled to the fourth node, and a second end of the second capacitor is coupled to a second voltage terminal;

wherein a voltage-controlled end of the second voltage-controlled switch is coupled to an output terminal of the second voltage comparator, a first end of the second voltage-controlled switch is coupled to the fourth node, and a second end of the second voltage-controlled switch is coupled to the second voltage terminal;

wherein a first input terminal of the second voltage comparator is coupled to the fourth node, and a second input terminal of the second voltage comparator is coupled to a fourth voltage terminal; and wherein the second voltage comparator is a hysteretic voltage comparator.

9. The oscillator circuit according to claim 8, wherein the first input terminal of the second voltage comparator is a non-inverting input terminal of the second voltage comparator, and the second input terminal of the second voltage comparator is an inverting input terminal of the second voltage comparator.

10. The oscillator circuit according to claim 1, wherein the second clock signal generating circuit comprises a second capacitor, a second voltage-controlled switch, a second voltage comparator, and a second one-way delay circuit, wherein a first end of the second capacitor is coupled to the fourth node, and a second end of the second capacitor is coupled to a second voltage terminal;

wherein a voltage-controlled end of the second voltage-controlled switch is coupled to an output terminal of the second one-way delay circuit, a first end of the second voltage-controlled switch is coupled to the fourth node, and a second end of the second voltage-controlled switch is coupled to the second voltage terminal; and wherein a first input terminal of the second voltage comparator is coupled to the fourth node, a second input terminal of the second voltage comparator is coupled to a fourth voltage terminal, and an output terminal of the second voltage comparator is coupled to an input terminal of the second one-way delay circuit.

11. The oscillator circuit according to claim 10, wherein the first input terminal of the second voltage comparator is a non-inverting input terminal of the second voltage comparator, the second input terminal of the second voltage comparator is an inverting input terminal of the second voltage comparator, and wherein the second one-way delay circuit is configured to continuously output a high voltage level signal for a predetermined period upon receiving the high voltage level signal.

12. The oscillator circuit according to claim 1, wherein the clock synchronization circuit comprises a frequency and phase discriminator, a third resistor, a fourth transistor, a fifth transistor, a sixth transistor, and to a seventh transistor, wherein a first input terminal of the frequency and phase discriminator is coupled to the sixth node, a second input terminal of the frequency and phase discriminator is coupled to the seventh node, and an output terminal of the frequency and phase discriminator is coupled to a control electrode of the fourth transistor;

wherein a first electrode of the fourth transistor is coupled to a first end of the third resistor, and a second electrode of the fourth transistor is coupled to a control electrode and a second electrode of the fifth transistor;

wherein a first electrode of the fifth transistor is coupled to a first voltage terminal;

wherein a control electrode of the sixth transistor is coupled to the control electrode of the fifth transistor, a first electrode of the sixth transistor is coupled to the first voltage terminal, and a second electrode of the sixth transistor is coupled to the eighth node;

wherein a control electrode of the seventh transistor is coupled to the control electrode of the fifth transistor, a first electrode of the seventh transistor is coupled to the first voltage terminal, and a second electrode of the seventh transistor is coupled to the fourth node; and wherein a second end of the third resistor is coupled to a second voltage terminal.

13. The oscillator circuit according to claim 1, wherein the control circuit comprises a third voltage-controlled switch, a fourth voltage-controlled switch, a fifth voltage-controlled switch, a sixth voltage-controlled switch, a seventh voltage-controlled switch, and an eighth voltage-controlled switch, wherein a voltage-controlled end of the third voltage-controlled switch is provided with the first frequency selecting signal, a first end of the third voltage-controlled switch is coupled to the first node, and a second end of the third voltage-controlled switch is coupled to the second node;

wherein a voltage-controlled end of the fourth voltage-controlled switch is provided with an inverted signal of the first frequency selecting signal, a first end of the fourth voltage-controlled switch is coupled to the eighth node, and a second end of the fourth voltage-controlled switch is coupled to the second node;

wherein a voltage-controlled end of the fifth voltage-controlled switch is provided with the first frequency selecting signal, a first end of the fifth voltage-controlled switch is coupled to the third node, and a second end of the fifth voltage-controlled switch is coupled to the sixth node;

wherein a voltage-controlled end of the sixth voltage-controlled switch is provided with the inverted signal of the first frequency selecting signal, a first end of the sixth voltage-controlled switch is provided with the external synchronization clock signal, and a second end of the sixth voltage-controlled switch is coupled to the sixth node;

wherein a voltage-controlled end of the seventh voltage-controlled switch is provided with the first frequency selecting signal, a first end of the seventh voltage-controlled switch is coupled to the seventh node, and a second end of the seventh voltage-controlled switch is coupled to the fifth node; and wherein a voltage-controlled end of the eighth voltage-controlled switch is provided with the inverted signal of the first frequency selecting signal, a first end of the eighth voltage-controlled switch is coupled to the seventh node, and a second end of the eighth voltage-controlled switch is coupled to the third node.

14. The oscillator circuit according to claim 1, wherein the output circuit comprises a ninth voltage-controlled switch and a tenth voltage-controlled switch, wherein a voltage-controlled end of the ninth voltage-controlled switch is provided with an inverted signal of the first frequency selecting signal, a first end of the ninth voltage-controlled switch is coupled to the third node, and a second end of the ninth voltage-controlled switch is coupled to an output terminal of the output circuit; and wherein a voltage-controlled end of the tenth voltage-controlled switch is provided with the first frequency selecting signal, a first end of the tenth voltage-controlled switch is coupled to the fifth node, and a second end of the tenth voltage-controlled switch is coupled to the output terminal of the output circuit.

15. An oscillator circuit, comprising an operational amplifier, a first resistor, a second resistor, a third resistor, a frequency and phase discriminator, a first transistor, a second transistor, a third transistor, a fourth transistor, a fifth transistor, a sixth transistor, a seventh transistor, a first capacitor, a second capacitor, a first voltage-controlled switch, a second voltage-controlled switch, a third voltage-controlled switch, a fourth voltage-controlled switch, a fifth voltage-controlled switch, a sixth voltage-controlled switch, a seventh voltage-controlled switch, an eighth voltage-controlled switch, a ninth voltage-controlled switch, a tenth voltage-controlled switch, a first voltage comparator, a second voltage comparator, a first one-way delay circuit, and a second one-way delay circuit, wherein a first input terminal of the operational amplifier is coupled to a reference voltage terminal, a second input terminal of the operational amplifier is coupled to a first end of the first resistor, and an output terminal of the operational amplifier is coupled to a control electrode of the first transistor;

wherein a second end of the first resistor is coupled to a second voltage terminal;

wherein a first end of the second resistor is coupled to a first electrode of the first transistor, and a second end of the second resistor is coupled to the first end of the first resistor;

wherein a second electrode of the first transistor is coupled to a control electrode and a second electrode of the second transistor;

wherein a first electrode of the second transistor is coupled to a first voltage terminal;

wherein a control electrode of the third transistor is coupled to the control electrode of the second transistor, a first electrode of the third transistor is coupled to the first voltage terminal, and a second electrode of the third transistor is coupled to a first end of the third voltage-controlled switch;

wherein a voltage-controlled end of the third voltage-controlled switch is provided with a first frequency selecting signal, and a second end of the third voltage-controlled switch is coupled to a first end of the first capacitor;

wherein a second end of the first capacitor is coupled to the second voltage terminal;

wherein a voltage-controlled end of the first voltage-controlled switch is coupled to an output terminal of the first one-way delay circuit, a first end of the first voltage-controlled switch is coupled to the first end of the first capacitor, and a second end of the first voltage-controlled switch is coupled to the second voltage terminal;

wherein a first input terminal of the first voltage comparator is coupled to the first end of the first capacitor, a second input terminal of the first voltage comparator is coupled to a third voltage terminal, and an output terminal of the first voltage comparator is coupled to an input terminal of the first one-way delay circuit;

wherein a first end of the second capacitor is coupled to a second electrode of the seventh transistor, and a second end of the second capacitor is coupled to the second voltage terminal;

wherein a voltage-controlled end of the second voltage-controlled switch is coupled to an output terminal of the second one-way delay circuit, a first end of the second voltage-controlled switch is coupled to the first end of the second capacitor, and a second end of the second voltage-controlled switch is coupled to the second voltage terminal;

wherein a first input terminal of the second voltage comparator is coupled to the first end of the second capacitor, a second input terminal of the second voltage comparator is coupled to a fourth voltage terminal, and an output terminal of the second voltage comparator is coupled to an input terminal of the second one-way delay circuit;

wherein a voltage-controlled end of the fourth voltage-controlled switch is provided with an inverted signal of the first frequency selecting signal, a first end of the fourth voltage-controlled switch is coupled to a second electrode of the sixth transistor, and a second end of the fourth voltage-controlled switch is coupled to the second end of the third voltage-controlled switch;

wherein a voltage-controlled end of the fifth voltage-controlled switch is provided with the first frequency selecting signal, a first end of the fifth voltage-controlled switch is coupled to the output terminal of the first one-way delay circuit, and a second end of the fifth voltage-controlled switch is coupled to a first input terminal of the frequency and phase discriminator;

wherein a voltage-controlled end of the sixth voltage-controlled switch is provided with the inverted signal of the first frequency selecting signal, a first end of the sixth voltage-controlled switch is provided with an external synchronization clock signal, and a second end of the sixth voltage-controlled switch is coupled to the first input terminal of the frequency and phase discriminator;

wherein a voltage-controlled end of the seventh voltage-controlled switch is provided with the first frequency selecting signal, a first end of the seventh voltage-controlled switch is coupled to a second input terminal of the frequency and phase discriminator, and a second end of the seventh voltage-controlled switch is coupled to the output terminal of the second one-way delay circuit;

wherein a voltage-controlled end of the eighth voltage-controlled switch is provided with the inverted signal of the first frequency selecting signal, a first end of the eighth voltage-controlled switch is coupled to the second input terminal of the frequency and phase discriminator, and a second end of the eighth voltage-controlled switch is coupled to the output terminal of the first one-way delay circuit;

wherein an output terminal of the frequency and phase discriminator is coupled to a control electrode of the fourth transistor;

wherein a first electrode of the fourth transistor is coupled to a first end of the third resistor, and a second electrode of the fourth transistor is coupled to a control electrode and a second electrode of the fifth transistor;

wherein a first electrode of the fifth transistor is coupled to the first voltage terminal;

wherein a control electrode of the sixth transistor is coupled to the control electrode of the fifth transistor, and a first electrode of the sixth transistor is coupled to the first voltage terminal;

wherein a control electrode of the seventh transistor is coupled to the control electrode of the fifth transistor, and a first electrode of the seventh transistor is coupled to the first voltage terminal;

wherein a second end of the third resistor is coupled to the second voltage terminal;

wherein a voltage-controlled end of the ninth voltage-controlled switch is provided with the inverted signal of the first frequency selecting signal, a first end of the ninth voltage-controlled switch is coupled to the output terminal of the first one-way delay circuit, and a second end of the ninth voltage-controlled switch is coupled to an output terminal of the oscillator circuit; and wherein a voltage-controlled end of the tenth voltage-controlled switch is provided with the first frequency selecting signal, a first end of the tenth voltage-controlled switch is coupled to the output terminal of the second one-way delay circuit, and a second end of the tenth voltage-controlled switch is coupled to the output terminal of the oscillator circuit.

16. The oscillator circuit according to claim 15, wherein the first resistor is arranged outside a package of the oscillator circuit.

17. The oscillator circuit according to claim 15, wherein the first input terminal of the first voltage comparator is a non-inverting input terminal of the first voltage comparator, and the second input terminal of the first voltage comparator is an inverting input terminal of the first voltage comparator, and wherein the first one-way delay circuit is configured to continuously output a high voltage level signal for a predetermined period upon receiving the high voltage level signal.

18. The oscillator circuit according to claim 15, wherein the first input terminal of the second voltage comparator is a non-inverting input terminal of the second voltage comparator, the second input terminal of the second voltage comparator is an inverting input terminal of the second voltage comparator, and wherein the second one-way delay circuit is configured to continuously output a high voltage level signal for a predetermined period upon receiving the high voltage level signal.

19. The oscillator circuit according to claim 15, wherein a voltage inputted from the third voltage terminal is equal to a voltage inputted from the fourth voltage terminal, and wherein a capacitance value of the first capacitor and a capacitance value of the second capacitor are equal.

20. The oscillator circuit according to claim 15, wherein the first transistor and the fourth transistor are N-channel metal oxide semiconductor (NMOS) transistors, and wherein the second transistor, the third transistor, the fifth transistor, the sixth transistor, and the seventh transistor are P-channel metal oxide semiconductor (PMOS) transistors.

* * * * *